United States Patent [19]
Heid

[11] Patent Number: 5,993,902
[45] Date of Patent: Nov. 30, 1999

[54] APPARATUS AND METHOD FOR EXTENDING THE LIFETIME OF AN EXHAUST SLEEVE FOR GROWING SINGLE CRYSTAL SILICON BY SILICON NITRIDE ($SI_3N_4$) COATING

[75] Inventor: Gary Randolph Heid, Vancouver, Wash.

[73] Assignee: SEH America, Inc., Vancouver, Wash.

[21] Appl. No.: 08/838,562

[22] Filed: Apr. 9, 1997

[51] Int. Cl.⁶ .............................. B05D 7/22; C23C 16/34; C30B 27/00
[52] U.S. Cl. .................. 427/237; 427/230; 427/255.28; 427/255.394; 427/255.395; 117/206; 117/208; 117/213; 117/217
[58] Field of Search .............................. 427/255.1, 248.1, 427/237, 230, 255.28, 255.394, 255.395; 117/13, 31, 206, 208, 209, 213, 217

[56] References Cited

U.S. PATENT DOCUMENTS

| | | |
|---|---|---|
| 4,090,851 | 5/1978 | Berkman .............................. 23/273 SP |
| 4,356,152 | 10/1982 | Berkman et al. . |
| 4,400,232 | 8/1983 | Ownby et al. ........................... 156/601 |
| 4,515,755 | 5/1985 | Matsuo et al. ........................... 422/246 |
| 4,565,711 | 1/1986 | Pinkhasov ................................ 427/50 |
| 4,633,913 | 1/1987 | Carty et al. .............................. 138/147 |
| 5,242,531 | 9/1993 | Klingshirn et al. .................. 156/620.4 |
| 5,270,020 | 12/1993 | Suzuki et al. ........................... 422/248 |
| 5,373,805 | 12/1994 | Takano et al. ............................. 117/18 |
| 5,476,065 | 12/1995 | Ikezawa et al. ........................ 117/217 |
| 5,578,131 | 11/1996 | Ye et al. .............................. 118/723 R |
| 5,585,914 | 12/1996 | Yamasaki et al. ........................ 356/44 |

*Primary Examiner*—Shrive Beck
*Assistant Examiner*—Michael Barr
*Attorney, Agent, or Firm*—Alston & Bird LLP

[57] ABSTRACT

An apparatus and a method for preventing buildup of silicon oxides and silicon carbides on the inner surface of exhaust sleeves utilized in Czochralski (Cz) silicon crystal pullers are provided. The apparatus and the method include the provision of a vapor impervious layer coated on the inner surface of an exhaust sleeve, and forming a barrier to silicon oxides and silicon carbides deposition on the inner surface, to prevent the buildup of silicon oxides and silicon carbides on the surface of exhaust sleeves, thereby allowing more uniform laminar flow of process gases in the Cz chamber and the exhaust sleeve, and extending the useful lifetime of exhaust sleeves.

6 Claims, 2 Drawing Sheets

APPARATUS AND METHOD FOR EXTENDING THE LIFETIME OF AN EXHAUST SLEEVE FOR GROWING SINGLE CRYSTAL SILICON BY SILICON NITRIDE (SI$_3$N$_4$) COATING

FIELD OF THE INVENTION

The present invention generally relates to the manufacturing of silicon crystals. More particularly, it relates to improvements of exhaust sleeves in Czochralski (Cz) silicon crystal pullers.

BACKGROUND OF THE INVENTION

Exhaust sleeves are used in growing crystals using the Czocharalski technique for removing exhaust process gases from a growing furnace. Exhaust sleeves are often made of graphite because of its useful high temperature properties. During the crystal growing process, however, silicon oxides and silicon carbides are often built-up on the surface of the exhaust sleeve. This buildup negatively impacts the evacuation process, and in a severe situation, it can lead to contamination through nitrogen flow in undesirable areas. Accordingly, the buildup in an exhaust sleeve requires that the exhaust sleeve be frequently replaced and/or cleaned.

Therefore, it is desirable to provide an apparatus and a method which can substantially reduce the buildup of silicon oxides and silicon carbides on the surface of exhaust sleeves, thus allowing more uniform laminar flow of process gases in the Cz chamber and exhaust sleeve and extending the lifetime of exhaust sleeves as well.

SUMMARY OF THE PREFERRED EMBODIMENTS

Illustrative preferred embodiments of the present invention are directed to an apparatus and a method for allowing more uniform laminar flow of process gases in the chamber and the exhaust sleeve utilized in Czochralski (Cz) silicon crystal pullers and for extending the lifetime of the exhaust sleeve. An important aspect of embodiments of the present invention is to prevent or substantially reduce the buildup of silicon oxides and silicon carbides on the inner surface of the exhaust sleeve, and thereby substantially extend the lifetime of the exhaust sleeve.

According to aspects of preferred embodiments of the present invention, the solid state reaction causing the buildup of silicon oxides and silicon carbides at the exhaust sleeve is believed to be:

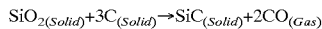

$$SiO_{2(Solid)} + 3C_{(Solid)} \rightarrow SiC_{(Solid)} + 2CO_{(Gas)}$$

where the SiO$_2$ solid makes up the quartz crucible, and some of solid SiO$_2$ can get into the process gases and travel down to the exhaust sleeve, the carbon (C) solid makes up the graphite exhaust sleeve, the silicon carbide (SiC) solid is the resulting composition on the surface of the graphite exhaust sleeve, and the gaseous carbon monoxide (CO) is the vapor product. The reaction consumes carbon which then causes the surface erosion of the exhaust sleeve. The gaseous carbon monoxide can lead to contamination through nitrogen flow in undesirable areas. The buildup of silicon oxides and silicon carbides on the surface of exhaust sleeves can negatively impact the evacuation process for process gases.

Therefore, it is an object of the present invention to prevent the buildup of silicon oxides and silicon carbides on the surface of exhaust sleeves, thereby allowing more uniform laminar flow of process gases in the Cz chamber and exhaust sleeve, and extending the useful lifetime of exhaust sleeves.

To achieve this object, according to aspects of the preferred embodiments of the present invention, an effective vapor impervious layer to silicon oxides and silicon carbides deposition is provided on the surface of an exhaust sleeve, to prevent the direct contact of the silicon dioxide (SiO$_2$) with the carbon (C) solid from the graphite exhaust sleeve, during the high temperature crystal growth.

This arrangement will prevent the formation of the carbon monoxide (CO) gas and the consumption of carbon at the surface of the exhaust sleeve, which would otherwise lead to the surface erosion of the exhaust sleeve, or possibly contamination through nitrogen flow in undesirable areas. Consequently, this arrangement would substantially reduce or prevent the buildup of silicon oxides and silicon carbides on the surface of exhaust sleeves, thereby allowing more uniform laminar flow of process gases in the chamber and exhaust sleeve, and extending the useful lifetime of exhaust sleeves.

Preferred embodiments of the present invention include an apparatus for a Czochralski (Cz) silicon crystal puller utilizing an exhaust sleeve for single crystal growth. The apparatus comprises a vapor impervious layer including a material that is a barrier to silicon oxides and silicon carbides deposition on a graphite surface, provided on the inner surface of the exhaust sleeve to reduce the buildup of both silicon oxides and silicon carbides on the surface of the exhaust sleeve.

Furthermore, other preferred embodiments of the present invention include a method for Czochralski (Cz) silicon crystal pulling utilizing an exhaust sleeve for single crystal growth. The method comprises the steps of preparing a material that is a barrier to silicon oxides and silicon carbides deposition on a graphite surface and providing a layer comprising said barrier material on the inner surface of the exhaust sleeve, for reducing the buildup of silicon oxides and silicon carbides on the surface of exhaust sleeves, thereby allowing more uniform laminar flow of process gases in the Cz chamber and exhaust sleeve, and extending the useful lifetime of exhaust sleeves.

In preferred embodiments of the present invention, silicon nitride (Si$_3$N$_4$) is chosen as the material for the barrier layer because it is an effective barrier to silicon oxides and silicon carbides deposition on a graphite surface. In one preferred embodiment of the present invention, the silicon nitride (Si$_3$N$_4$) layer is provided as a coating on the inner surface of the exhaust sleeve. The silicon nitride (Si$_3$N$_4$) coating can be formed by various techniques and processes, e.g., by chemical vapor deposition (CVD).

Further benefits and advantages of the invention will become apparent from a consideration of the following detailed description given with reference to the accompanying drawings, which specify and show preferred embodiments of the present invention.

BRIEF DESCRIPTION OF THE DRAWINGS

The above-mentioned and other features of this invention and the manner of obtaining them will become more apparent, and will be best understood by reference to the following description, taken in conjunction with the accompanying drawings. These drawings depict only typical embodiments of the invention and do not, therefore, limit its scope. They serve to add specificity and detail, in which.

DETAILED DESCRIPTION OF THE INVENTION

Figure 1:
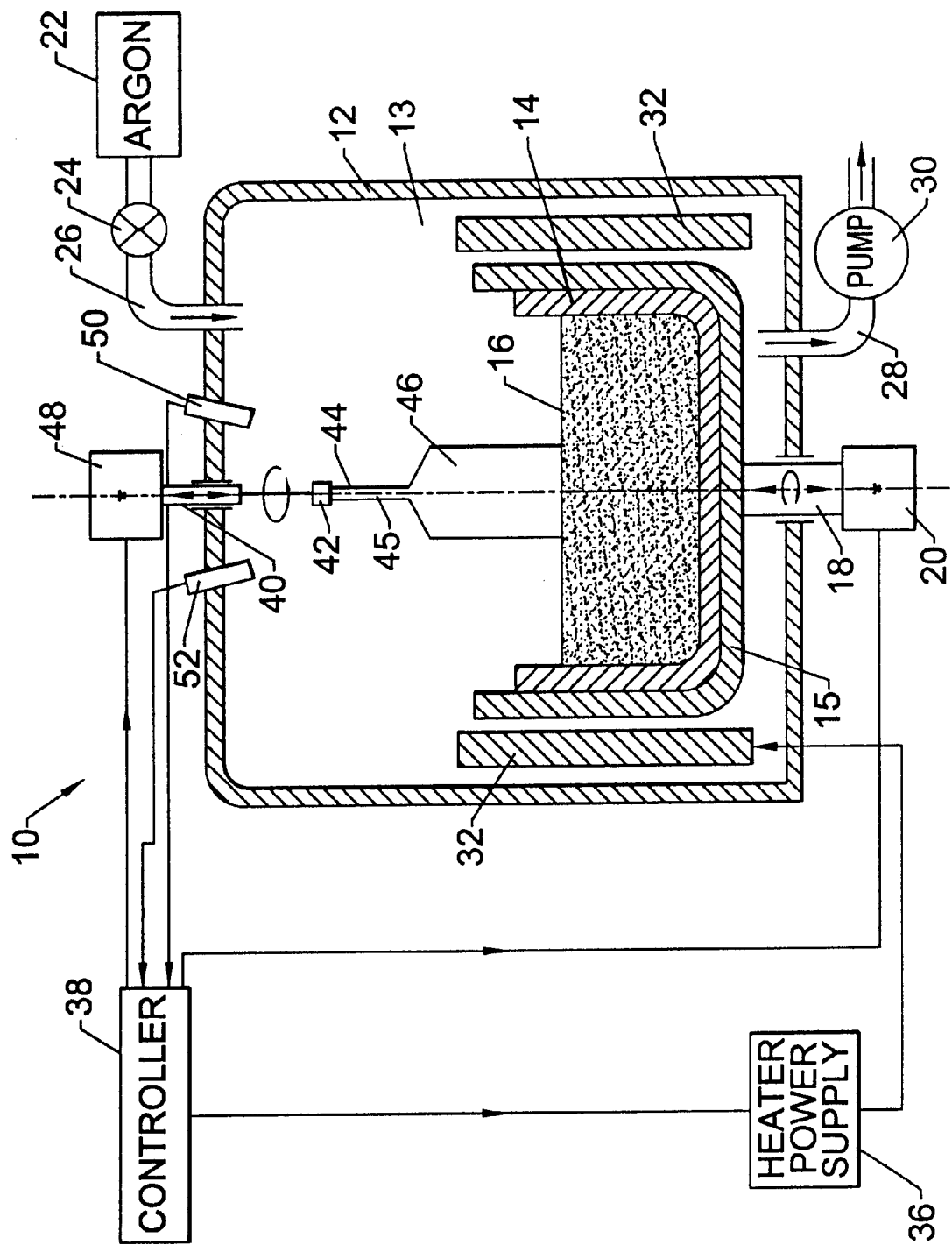
FIG. 1 is an illustrative diagram, partly in cross-section, depicting the arrangement of a Czochralski (Cz) silicon crystal puller, which utilizes embodiments of the present invention.

Referring to FIG. 1, there is shown an illustrative diagram of a Czochralski (Cz) silicon crystal manufacturing apparatus or Cz crystal puller 10, which utilizes the present invention.

Cz silicon crystal manufacturing apparatus 10 comprises a hermetically sealed furnace 12 defining a Cz chamber 13. Located at the center of the Cz crystal puller 10 is a quartz crucible 14 for containing polysilicon melt 16. The crucible 14 is assembled within a graphite susceptor 15, which is in turn mounted on a crucible rotary shaft 18. The crucible 14 can be rotated by the crucible rotary shaft 18, driven by a rotary shaft motor 20.

The Cz crystal puller 10 also comprises an argon source 22 which supplies argon gas to the Cz crystal puller 10. The gas flow is controlled by the argon gas inlet valve 24 before introduction into the hermetically sealed furnace 12 through the argon gas inlet 26 located at the upper corner of the furnace 12. The exhaust gases are removed from the furnace 12 through an exhaust sleeve 28 located at the lower corner of the furnace 12. A pump 30 is connected to the exhaust sleeve 28 to provide suction. The exhaust sleeve 28 is made of graphite.

A heating element 32 is assembled surrounding the graphite susceptor 15 between the graphite susceptor 15 and the hermetically sealed furnace 12 to provide heating to the quartz crucible 14. A heater power supply 36 is connected to the heating element 32 to power the heating element. A controller 38 is connected to the heater power supply 36 to control the heater power supply 36.

An elongated rotary shaft 40 extends downwardly through the top of the furnace 12 for suspending a crystal chuck 42 and a seed 44. During crystal growth, a crystal neck section 45 is first formed. Then a single crystal ingot 46 is formed as the molten silicon 16 crystallizes at the liquid-solid interface between the single crystal ingot 46 and the molten silicon 16 while the rotary shaft 40 pulls the silicon crystal ingot 46 from the molten silicon 16. During the crystal growth period, the crystal ingot 46 is rotated by the rotary shaft 40, which is driven by a rotary shaft motor 48. Typically, the crystal ingot 46 is rotated in one direction, while the crucible 14 is rotated in an opposite direction by the crucible rotary shaft 18, to facilitate the formation of the crystal ingot 34.

A camera 50 and a pyrometer 52 are located on the top of the furnace 12 to supply data to the controller 38. The controller 38 controls the rotation of the rotary shaft motor 48, the crucible rotary shaft motor 20, and the heater power supply 36 output for optimizing process conditions.

Figure 2:
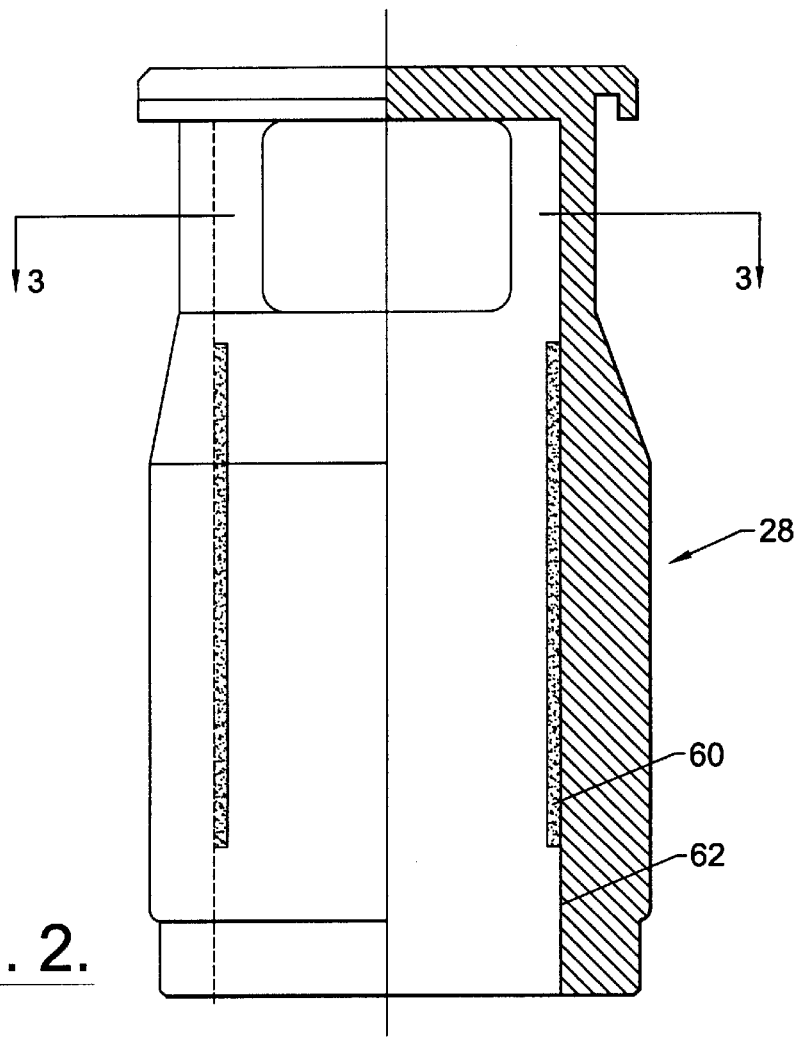
FIG. 2 is an illustrative vertical cross-section diagram of an exhaust sleeve of the present invention showing buildup locations of silicon oxides and silicon carbides.

FIG. 2 shows a vertical cross-sectional view of the exhaust sleeve 28 utilized in a Cz crystal puller of the present invention. During the growth of a single silicon crystal, exhaust process gases together with solid $SiO_2$ from the quartz crucible 14 are removed from the furnace 12 through the exhaust sleeve 28, and silicon oxides and silicon carbides 60 are deposited on the inner surface 62 of the exhaust sleeve 28. Such a buildup of silicon oxides and silicon carbides negatively impacts the evacuation process, and causes the erosion of the exhaust sleeve 28.

Figure 3:
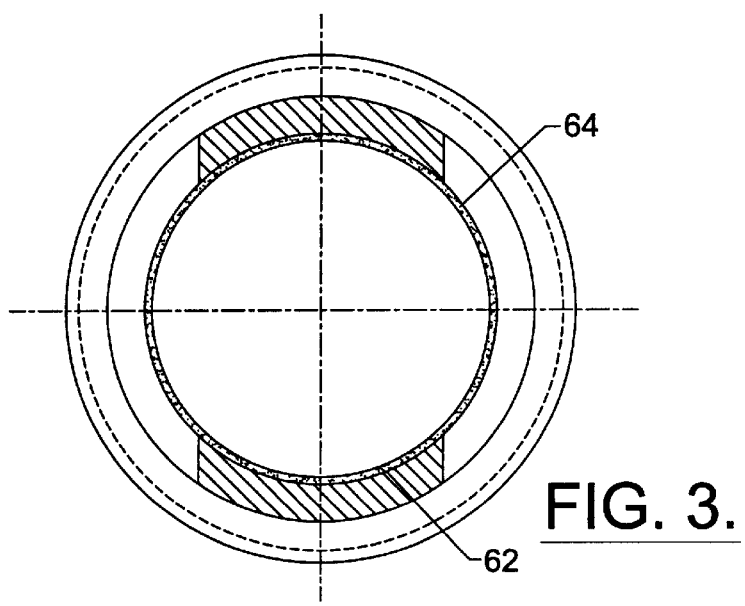
FIG. 3 is an illustrative vertical cross-section diagram of an exhaust sleeve of the present invention showing a preferred embodiment of the present invention, where a vapor impervious layer to silicon oxides and silicon carbides deposition is provided as a coating on the inner surface of the exhaust sleeve.

Aspects of embodiments of the present invention improve over conventional Czochralski (Cz) silicon crystal pullers by providing a vapor impervious layer 64 on the inner surface 62 of the exhaust sleeve 28, as shown in FIG. 3. In one preferred embodiment, the vapor impervious layer 64 can be a coating on the entire inner surface of the exhaust sleeve 28. Preferably, the thickness of the vapor impervious layer 64 ranges from about 3 to 7 mils on the entire inner surface of the graphite exhaust sleeve 28.

The coated vapor impervious layer 64 provides a barrier to silicon oxides and silicon carbides deposition on the inner surface 62 of the exhaust sleeve 28. As discussed above, erosion on the inner surface of a conventional exhaust sleeve is caused by the deposition of silicon oxides and silicon carbides on the surface of the exhaust sleeve during crystal growth. Protected by the vapor impervious layer 64, as in preferred embodiments of the present invention, silicon oxides and silicon carbides can no longer deposit on the inner surface of the exhaust sleeve 28. This arrangement can effectively prevent the erosion caused by carbon loss from the inner surface of a conventional exhaust sleeve during high-temperature crystal growth. Preferred embodiments of the present invention, therefore, substantially reduce the replacement and/or cleaning of the exhaust sleeve 28 that would otherwise result from such surface erosion, and substantially extend the lifetime of the exhaust sleeve 28. Also, the reduction of the buildup of silicon oxides and silicon carbides allows more uniform laminar flow of process gases in the Cz chamber 13 and the exhaust sleeve 28.

In preferred embodiments of the present invention, the material used for the coating is silicon nitride ($Si_3N_4$). The silicon nitride ($Si_3N_4$) layer may be coated onto the inner surface 62 of the exhaust sleeve 28 by a chemical vapor deposition (CVD) process or other suitable coating processes.

Several well known chemical vapor deposition (CVD) techniques may be used for producing a $Si_3N_4$ coating layer on the inner surface of an exhaust sleeve. Examples of CVD techniques include but are not limited to: (a) passing a mixture of silicon tetrachloride and ammonia over the substrate being coated in a carrier gas and heating the substrate to about 1000° C., or (b) passing a mixture of silane and ammonia over the substrate being coated which is heated to a temperature between about 800° C. and 1000° C. Other CVD techniques are also described in U.S. Pat. Nos. 4,090,851; 4,350,152; and 4,565,711, the text of which are incorporated herein.

An important advantage of preferred embodiments of the present invention is that the buildup of silicon oxide and silicon carbides in the exhaust portions of a Cz crystal puller is substantially reduced or prevented, and therefore flow problems in the exhaust chamber are also reduced or prevented.

It will, of course, be understood that modifications of the present invention, in its various aspects, will be apparent to those skilled in the art, some being apparent only after study, and others being matters of routine mechanical, chemical and electronic design. Other embodiments are also possible, their specific designs depending upon the particular application. As such, the scope of the invention should not be limited by the particular embodiments herein described but should be defined only by the appended claims and equivalents thereof.

A system in accordance with the present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalence of the claims are to be embraced within their scope.

What is claimed is:

1. A Czochralski (Cz) crystal puller comprising:

a furnace defining a Cz chamber;

an exhaust sleeve operably connected to said furnace for receiving exhaust gases including $SiO_2$ from the Cz chamber, said exhaust sleeve having an inner surface; and a vapor impervious layer that coats at least portions of the inner surface of said exhaust sleeve, said vapor impervious layer comprised of silicon nitride ($Si_3N_4$) to prevent a reaction of the exhaust gases including $SiO_2$ with the exhaust sleeve and to thereby reduce the buildup of oxides and carbides on the inner surface of the exhaust sleeve.

2. The apparatus as defined in claim 1, wherein said vapor impervious layer is coated on the entire inner surface of the exhaust sleeve.

3. The apparatus as defined in claim 1, wherein the thickness of the vapor impervious layer is about 3 to 7 mils.

4. A method of fabricating a Czochralski (Cz) crystal pulling apparatus having a furnace defining a Cz chamber, the method comprising the steps of:

(a) providing an exhaust sleeve adapted to be operably connected to the furnace so as to receive exhaust gases including $SiO_2$ from the Cz chamber, the exhaust sleeve having an inner surface; and (b) coating at least a portion of the inner surface of the exhaust sleeve with silicon nitride ($Si_3N_4$) to prevent a reaction of the exhaust gases including $SiO_2$ with the exhaust sleeve and to thereby reduce the buildup of oxides and carbides on the inner surface of the exhaust sleeve, thereby allowing more uniform laminar flow of exhaust gases in the exhaust sleeve.

5. The method as defined in claim 4, wherein said step (b) includes coating the entire inner surface of the exhaust sleeve with silicon nitride ($Si_3N_4$).

6. The method as defined in claim 5, wherein said step (b) includes coating said silicon nitride ($Si_3N_4$) by a chemical vapor deposition technique.

* * * * *